United States Patent [19]

Hulett et al.

[11] Patent Number: 5,448,255
[45] Date of Patent: * Sep. 5, 1995

[54] DUAL BAND DOWN CONVERTER FOR MMDS/MDS ANTENNA

[75] Inventors: Paul W. Hulett, Mediapolis; Dale L. Hemmie; Marc D. Mills, both of Burlington, all of Iowa

[73] Assignee: Conifer Corporation, Burlington, Iowa

[*] Notice: The portion of the term of this patent subsequent to Mar. 28, 2012 has been disclaimed.

[21] Appl. No.: 297,900

[22] Filed: Aug. 30, 1994

Related U.S. Application Data

[63] Continuation of Ser. No. 69,354, May 27, 1993, Pat. No. 5,402,138, which is a continuation-in-part of Ser. No. 4,968, Jan. 5, 1993, Pat. No. 5,300,941, which is a continuation of Ser. No. 707,918, May 30, 1991, Pat. No. 5,202,699.

[51] Int. Cl.⁶ .................. H01Q 19/13; H01P 1/20
[52] U.S. Cl. .................... 343/840; 333/126; 333/134; 333/204
[58] Field of Search ............ 333/126, 134, 175, 185, 333/202, 204, 247; 343/786, 795, 820–822, 840, 878, 880–883, 850–852; 455/280, 288, 293, 333; H01Q 23/00

[56] References Cited

U.S. PATENT DOCUMENTS

| | | | |
|---|---|---|---|
| 3,162,858 | 12/1964 | Cutler | 343/753 |
| 4,290,068 | 9/1981 | Bogner | 343/702 |
| 4,295,143 | 10/1981 | Winegard et al. | 343/840 |
| 4,513,293 | 4/1985 | Stephens | 343/840 |
| 4,595,890 | 6/1986 | Cloutier | 333/21 A |
| 4,791,717 | 12/1988 | Hemmie | 29/600 |
| 4,811,031 | 3/1989 | Maile et al. | 343/840 |
| 4,896,163 | 1/1990 | Shibata et al. | 343/786 |
| 5,008,956 | 4/1991 | Hemmie | 33/203 |
| 5,019,833 | 5/1991 | Nonaka | 343/840 |
| 5,020,149 | 5/1991 | Hemmie | 455/325 |
| 5,027,430 | 6/1991 | Yamauchi et al. | 455/188.1 |
| 5,122,878 | 6/1992 | Heigl et al. | 455/180.1 |
| 5,202,699 | 4/1993 | Hemmie et al. | 343/840 |
| 5,300,941 | 4/1994 | Hemmie et al. | 343/840 |

FOREIGN PATENT DOCUMENTS

| | | | |
|---|---|---|---|
| 1149931 | 7/1983 | Canada | 343/840 |
| 0076642 | 6/1981 | Japan | H01Q 19/13 |
| 0003439 | 1/1982 | Japan | 455/339 |
| 0238130 | 10/1986 | Japan | H01Q 19/02 |
| 0000101 | 1/1987 | Japan | 333/134 |
| 0297901 | 12/1989 | Japan | 333/204 |
| 0055809 | 3/1993 | Japan | 333/202 |

Primary Examiner—William Mintel
Assistant Examiner—Peter Toby Brown
Attorney, Agent, or Firm—Zarley, McKee, Thomte, Voorhees & Sease

[57] ABSTRACT

A dual band MDS/MMDS down converter receiving system wherein the support boom of a semi-parabolic antenna contains the down converter electronics. Located at the focal area of the semi-parabolic antenna are a pair of driven feed elements which are connected to the printed circuit board carrying the dual band down converter electronics. The dual band down converter is formed in an elongated shape to fit entirely within the formed hollow interior of the support boom. The down converter comprises a first printed circuit board which contains a low noise amplifier, two RF filters, and two diplexer filters located at the input end of the printed circuit board. The RF filters are mounted on opposite sides of the printed circuit board. The input is directly connected to the pair of driven feed elements. The RF filters are surrounded by input ground shields.

5 Claims, 10 Drawing Sheets

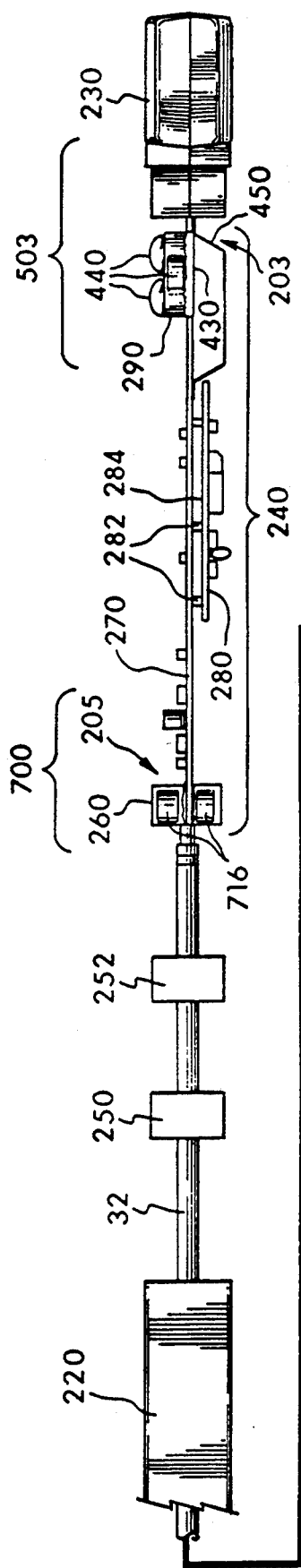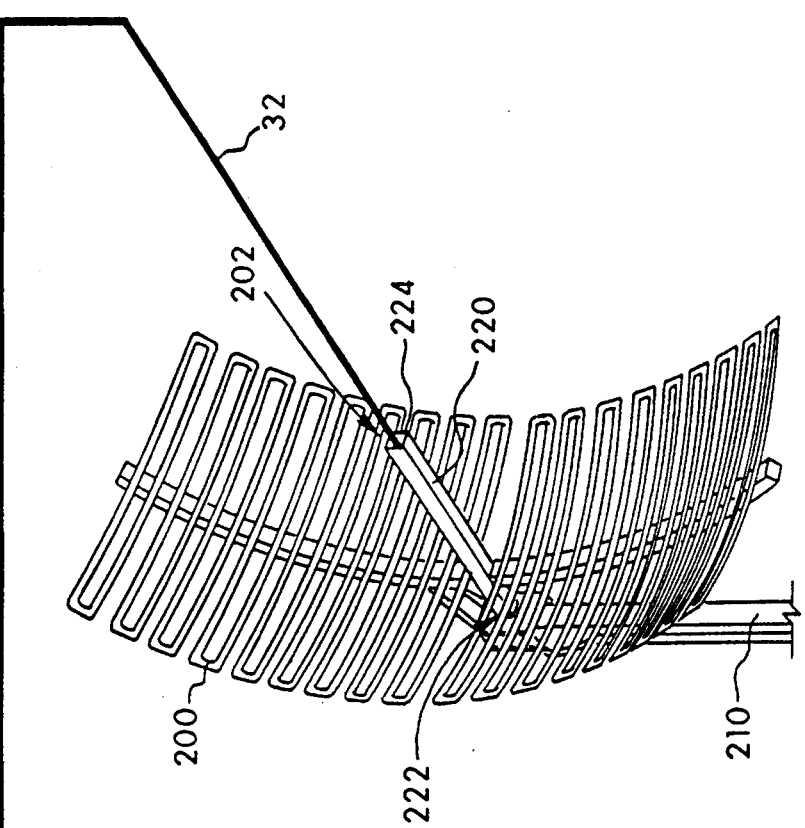
Fig. 2

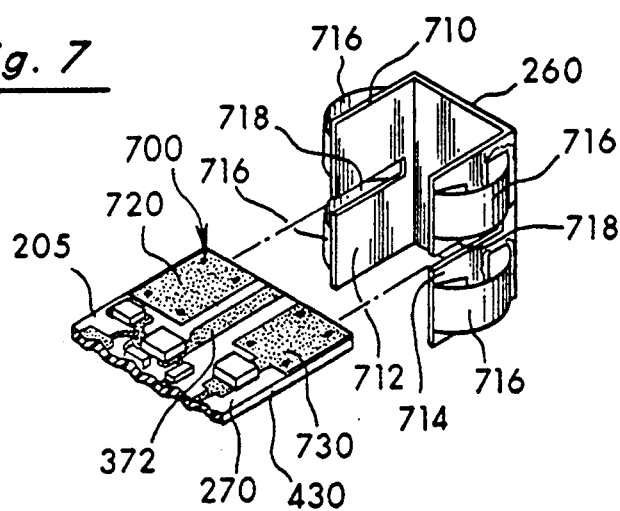
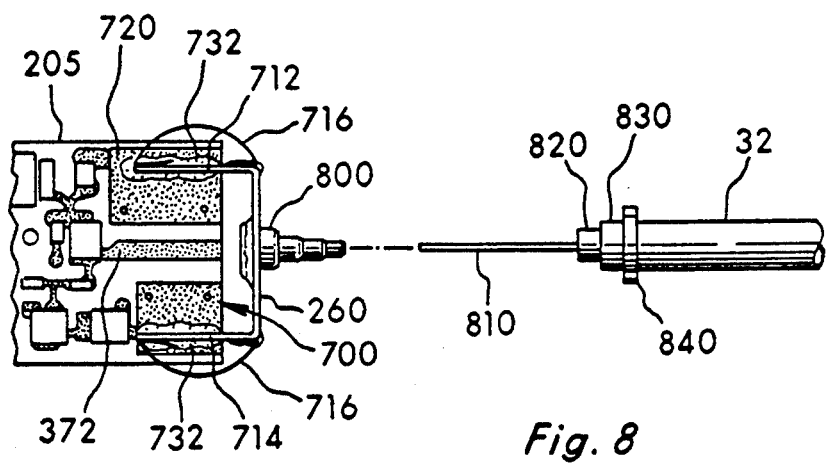
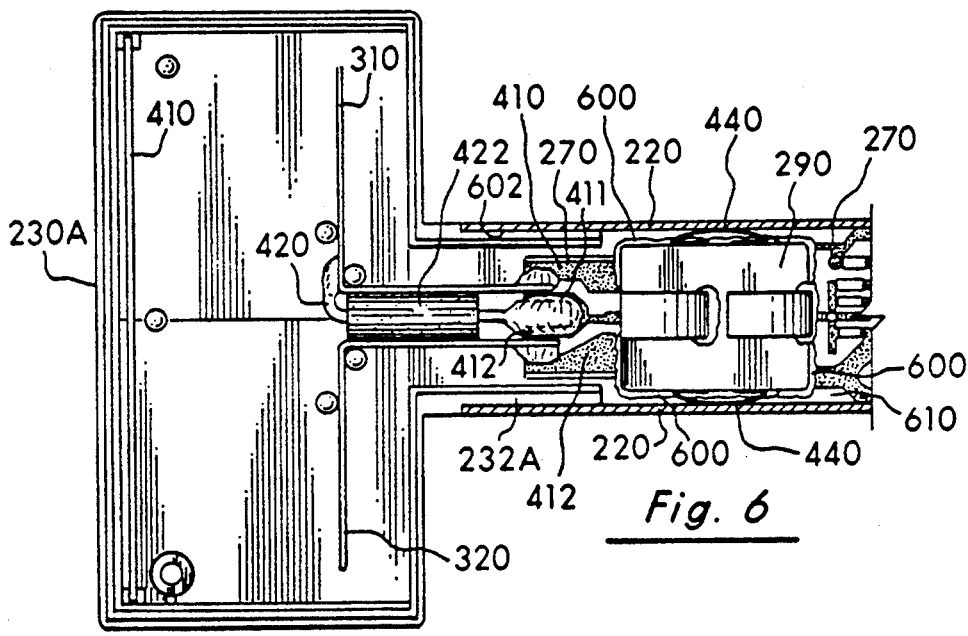

Fig. 14
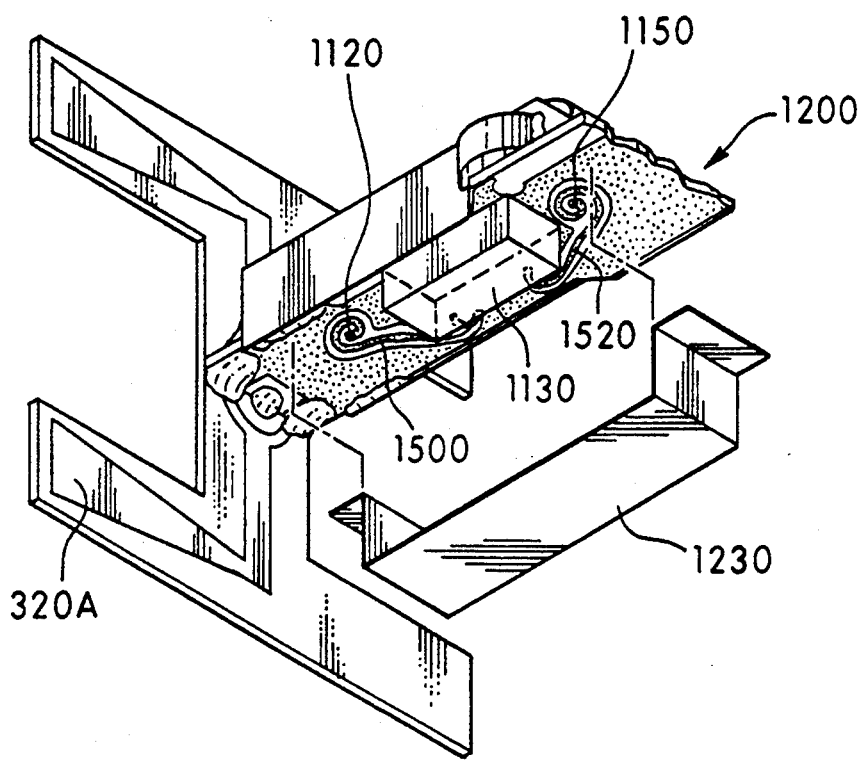
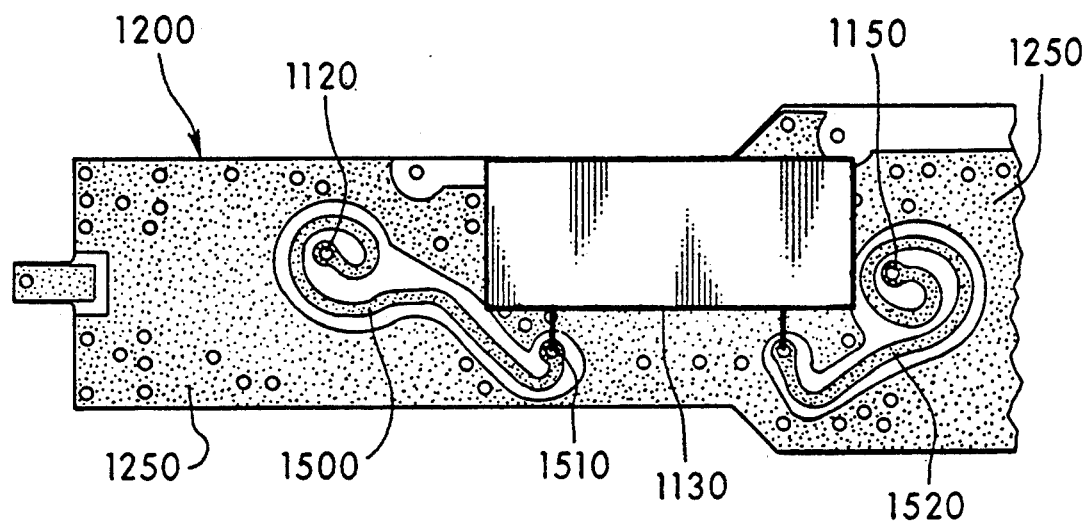
Fig. 15

DUAL BAND DOWN CONVERTER FOR MMDS/MDS ANTENNA

This application is a continuation of Ser. No. 08/069,354, filed 27 May 1993, now U.S. Pat. No. 5,402,138; which is a continuation in part of Ser. No. 08/004,968, filed 05 Jan. 1993, now U.S. Pat. No. 5,300,941; which is a continuation of Ser. No. 07/707,918, filed 30 May 1991, now U.S. Pat. No. 5,202,699.

BACKGROUND OF THE INVENTION

Field of the Invention

This invention relates to down converters for semi-parabolic antennas for use in multichannel multipoint distribution systems (MMDS) and multipoint distribution system (MDS) (also termed "wireless cable") and, in particular, to integrating the down converter into the feed boom or support for semi-parabolic antennas for dual band reception.

Statement of the Problem

Wireless cable is competing with cable to offer programming to the public. Wireless cable utilizes a semi-parabolic reflector which is mounted on the rooftop of a consumer's house. Multiple channels are delivered to this semi-parabolic reflector from a remote location. Conventional microwave semi-parabolic antenna systems utilize an antenna with a separate single band down converter mounted on the backside of the antenna with coaxial cable and connectors interconnecting the two elements.

A need exists to provide a low cost down converter having dual band reception—one for MDS and one for MMDS—which shares common circuitry to a large extent in order to reduce costs.

A further need exists to integrate the separate down converter into the semi-parabolic reflector in order to reduce wind load of the overall antenna and down converter receiving system, to provide a system which can be installed with a minimum of installation time, to eliminate the need for a separate down converter housing (thus reducing the material and labor costs of the system), to eliminate the coaxial cable and connectors interconnecting the antenna and the down converter in order to reduce the signal loss between the antenna and the down converter (thereby improving the overall system signal to noise ratio at a significantly lower materials cost), and to improve the impedance matching between the antenna and the down converter which allows for an optimum signal transfer.

A further need exists to provide an integrated MMDS/MDS antenna incorporating a dual band down converter in the support boom. Such a dual band integrated down converter would need to fit within the interior of the support boom and provide a high quality, low noise output signal for each band.

Results of a Patentability Search

A patentability search was conducted on the teachings of the present invention with respect to a solution to the above problem as it relates to integrating the down converter into the support boom. The following patents were uncovered in this search:

| Patent No. | Inventor | Issue Date |
|---|---|---|
| 3,162,858 | Cutler | 12-22-64 |
| 4,290,068 | Bogner | 9-15-81 |
| 1,149,931 | Thomas (Canada) | 7-12-83 |

The 1964 patent to Cutler sets forth a ring focus antenna feed for a parabolic dish antenna. Cutler discloses a feed connected to a circular waveguide which in turn is connected to an amplifier. The amplifier and the circular waveguide are contained within a supporting pedestal. The amplifier is then interconnected through a second circular waveguide to the transceiver. The second circular waveguide and the transceiver are located behind the parabolic dish. The amplifier and the first circular waveguide are located in the pedestal which supports the feed.

The 1981 patent to Bogner sets forth a multipoint distribution system (MDS) disk-on-rod type antenna. To the rear of the spaced-apart disk is located a waveguide which includes a cylindrical container having a closed back and sidewalls with an open mouth. Bogner incorporates the down converter into the waveguide in order to reduce wind load and to reduce transmission loss. In implementing the down converter into the waveguide, Bogner requires that it must be contained in less than fifty percent of the volume of the waveguide cavity. Bogner houses his down converter in a separate metal structure within the waveguide. Because the down converter is located in a waveguide, the waveguide must have precise dimensions based upon the wavelength of the signal being sensed. Bogner requires that the metal structure containing the down converter electronics must not touch the sidewalls of the waveguide since to do so would change the waveguide and wavelength. The Bogner approach is critically designed for a frequency of 2153 MHz.

The 1983 Canadian patent to Thomas also relates to an MDS antenna suitable for receiving a single microwave transmission in the 2.15 gigahertz range. Thomas utilizes a semi-parabolic antenna having its feed supported by a hollow tubular support in which Thomas integrates the down converter or a portion of the down converter. Thomas connects the feed elements through a matching network to a coaxial cable which interconnects the matching network to a mixer located within the tubular support. The mixer carries the input RF signal from the feed elements to a signal from the local oscillator and the difference of the input signal (2154.75 MHz) and the local oscillator frequency (2216.0 MHz) is delivered into a set of IF amplifiers whose output is connected to a standard coax cable. The circuit board carrying the electronics contained within the tubular support is grounded to the tubular support by means of an arcuate metal conductor. The conductor electrically connects the printed overlay of the board with the inside metallic surfaces of the support arm. The outer sheath of the coaxial cable which interconnects the mixer with the matching network is also connected to the copper overlay of the circuit board. Likewise, the outer sheath of the coaxial cable interconnecting the outputs of the IF amplifiers and the customer's television set is also grounded to the copper overlay.

Of the three patents found in the search, only the Thomas patent is pertinent. The Bogner approach utilizes a critically designed waveguide having disposed within the waveguide the down converter electronics.

The package for the down converter electronics is critically designed and is electrically insulated from the waveguide. Cutler places the amplifier within the feed support but requires a waveguide to extend the signal from the feed to the amplifier. Thomas, like the present invention, utilizes a semi-parabolic antenna and places the down converter or a portion thereof into the tubular support arm which supports the feed. Thomas, while solving the problem with respect to minimizing windload and reducing the number of separate parts and components, does not provide a system for providing MMDS programming. Hence, a need still exists when implementing the down converter into the tubular support arm to provide RF filtering in order to minimize IF and image type interference, to provide circuit shielding to prevent unwanted signals from radiating past input filtering, to provide multiple grounding connections between the circuit board and the inside of the support boom to maintain the integrity of RF filtering and shielding, to utilize an RF amplifier stage to establish low noise performance, to provide broad band mixing performance with high signal handling characteristics, to reference a stabilized oscillator, and to provide an integrated down converter/antenna system which is compatible with encryption/addressable systems. The Thomas approach was only concerned with processing a single microwave TV channel and was not concerned with the interference potential of other channels in an MMDS configuration. Furthermore, Thomas did not fully eliminate the coaxial cable interconnections.

None of the three patents discussed above provide a dual band down converter.

Solution to the Problem

The present invention provides solutions to the above stated problems, a solution which is not met by the above three patents.

The integrated antenna/down converter of the present invention provides a new dual band approach for wireless cable as well as an integrated design for MMDS/MDS dual band receive antennas. By integrating all the necessary components in the antenna, installation times are kept to a minimum and there is a reduction in inventory parts used by the MMDS/MDS operator. The integrated antenna/dual band down converter unit of the present invention can be packaged for consumer installations to allow for more cost savings by the system operator. All necessary cables and connectors are provided for consumer installation. The semi-parabolic reflector of the present invention mounts the dual band down converter in the feed support boom.

The integrated antenna/dual band down converter of the present invention also provides significant RF filtering so as to minimize IF and image type interference. This is accomplished by providing circuit shielding at the input from the feed which prevents signals from radiating past the input filtering and at the output. Multiple grounding connections exist between the circuit board and the inside of the support boom at the input and output ends. Furthermore, and RF amplifier stage is provided with a pre-amplifier to obtain low noise performance. Broad band mixing performance with high signal handling characteristics are also provided. The circuit of the present invention utilizes a stabilized reference oscillator physically isolated from the main portion of the electronics which also minimizes signal interference. The integrated dual band down converter/antenna system of the present invention is compatible with encryption/addressable systems.

SUMMARY OF THE INVENTION

An integrated semi-parabolic antenna/dual band down converter MMDS/MDS receiving system is disclosed wherein the support boom of a semi-parabolic antenna contains the dual band down converter electronics. Located at the focal area of the semi-parabolic antenna are a pair of driven feed elements which are electrically connected to the printed circuit board carrying the dual band down converter electronics. The support boom of the present invention is square in cross-sectional shape and has a formed hollow interior. The dual band down converter of the present invention is formed in an elongated shape to fit entirely within the formed hollow interior of the support boom.

The dual band down converter comprises a first printed circuit board which contains a low noise amplifier coupled through a diplexer to two RF filters located at the input end of the printed circuit board. The input of the low noise amplifier is electrically connected to the feed on the first printed circuit board. The low noise amplifier and the RF filters are surrounded by input ground shields which cover the RF filter circuitry. The shields are soldered to the top and bottom ground planes of the printed circuit board. A plurality of ground clips are located on the ground shield so as to firmly abut against the interior sides of the support boom in order to establish an electrical ground connection and to position the printed circuit board within the hollow interior of the support boom. In addition, a ground clip is connected to the bottom ground plane in the area of the RF ground shield which cooperates with the aforementioned ground clips. At the opposite end of the printed circuit board is an output amplifier whose output is connected to a coax output lead. A coax ground shield engages the opposite end of the first printed circuit board in a perpendicular orientation so as to position the opposite end of the printed circuit board within the hollow interior. The coax ground shield is connected to the coax ground and to the top and bottom ground planes of the printed circuit board and functions to minimize interfering radiation. A plurality of ground clips are mounted onto the coax ground shield so as to establish an electrical ground connection to the interior of the support boom and to position the opposite end of the down converter centrally within the hollow interior.

The reference oscillator for the down converter is mounted on a second printed circuit board which is spaced from the first printed circuit board and is oriented to have its bottom ground plane facing the bottom ground plane of the first printed circuit board. This arrangement substantially minimizes interference between the reference oscillator and the remaining down converter electronics.

The dual band down converter, whether integrated into the support boom or stand-alone behind the reflector, is receptive of MMDS/MDS signals from the dipole feed. The signals received are first amplified by a low noise amplifier and then delivered into a first diplexer circuitry. The diplexer functions to separate the MDS signals from the MMDS signals. From the diplexer, the signals flow through their respective RF filters. The output signals of each filter are then recombined by a second diplexer circuit. The output of the second diplexer circuit is fed into the low noise amplifier for delivery into the common mixer, oscillator, and the associated down converter electronics.

DESCRIPTION OF THE DRAWING

FIG. 2 is an illustration of the various components of the present invention.

FIG. 6 is a top cutaway planar view of the front end of the down converter of the present invention as interconnected with the drive elements.

FIG. 7 is a perspective view of the output end of the down converter of the present invention.

FIG. 8 is a top planar view showing the connection of the coax bracket of the present invention connected to the output end of the down converter of the present invention.

FIG. 14 is a bottom perspective view illustrating the MMDS components.

FIG. 15 is a bottom planar view of the printed circuit board of FIG. 13 illustrating the connection path for the MMDS RF filter.

SPECIFICATION

1. Overview

Figure 1:
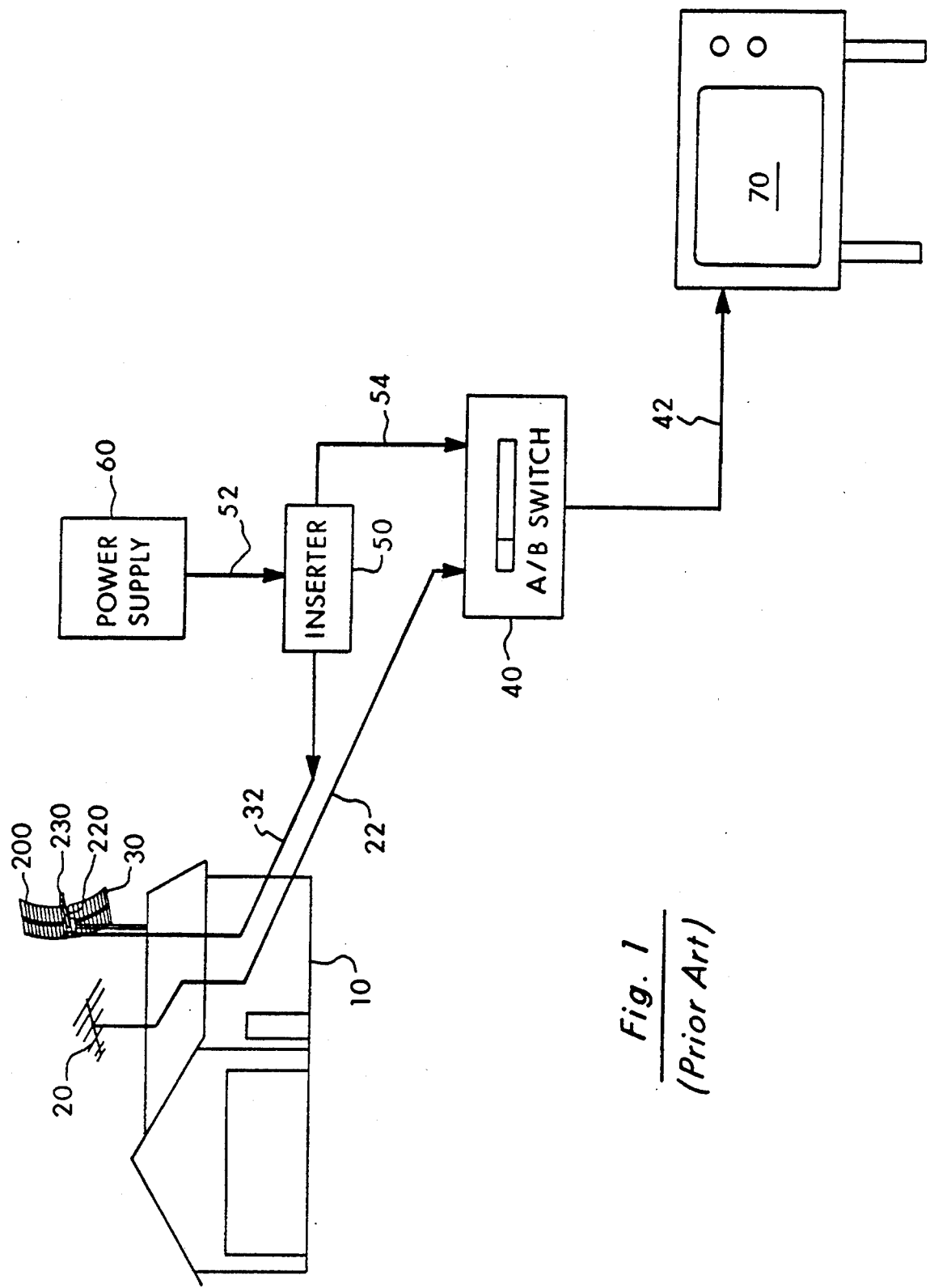
FIG. 1 is an illustration showing the integrated antenna/down converter of the present invention interconnected with a consumer's television system.

In FIG. 1, the environment in which the integrated antenna/down converter of the present invention is utilized is shown. On a consumer's house 10 is mounted a normal antenna 20 and a semi-parabolic MMDS integrated antenna/down converter 30 of the present invention. The conventional antenna 20 is interconnected by means of coaxial cable 22 into a conventional A/B switch 40. The integrated antenna/down converter 30 is also interconnected over coaxial cable 32 to a power inserter 50 which inserts power over lines 52 from a power supply 60. The power inserter 50 is connected by means of coaxial cable 54 to the AB switch 40. The power inserter 50 is conventional and provides power over coax 32 for powering the down converter portion of the integrated antenna/down converter 30. The A/B switch 40 conventionally selects between the programming available from antenna 20 or from the multiple channels on coax 54 from the MMDS antenna 30. The A/B switch is connected by means of a jumper cable 42 to a consumer's TV 70. The system configuration of FIG. 1 is conventional and is shown to simply illustrate the environment in which the integrated antenna/down converter of the present invention operates. Furthermore, it illustrates how power is conventionally supplied over coax 32 to the integrated antenna/down converter 30 of the present invention.

In FIG. 2, the integration of the antenna with the down converter of the present invention is shown. A conventional semi-parabolic antenna 200 is mounted to a support post 210. Connected to the antenna 200 is a support boom 220 which, in the preferred embodiment, is a one inch square boom. Any suitable size and suitable geometrical cross-sectional shape (such as rectangular, hexagonal, octagonal, or circular) could also be used. The boom 220 supports a feed housing 230 located in the focal point 202 of the antenna 200. Under the teachings of the present invention, the down converter 240 is located on the interior of the support boom 220. A pair of weatherproof seals 250 and 252 are located in the end 222 of the boom 220 nearest the antenna 200. The down converter 240 is located within the hollow interior of the support boom 220 and the feed 230 is mounted on the end 224 farthest from the antenna 200.

The down converter 240 includes the coax bracket 260, an oscillator board 270 having an input end 203 and an output end 205, a daughter board 280, and a front end filter shield 290. While the present invention integrates the down converter into the hollow interior of the support boom of a semi-parabolic antenna, it is to be expressly understood that the teachings of the present invention find application in full parabolic dish antennas or any suitable microwave antenna. Therefore, the shape of the antenna 200 is not a limiting factor to the teachings contained herein.

2. Down Converter Overview

What follows is a brief description of the electronic components used in the down converter 240 of the present invention.

Figure 3:
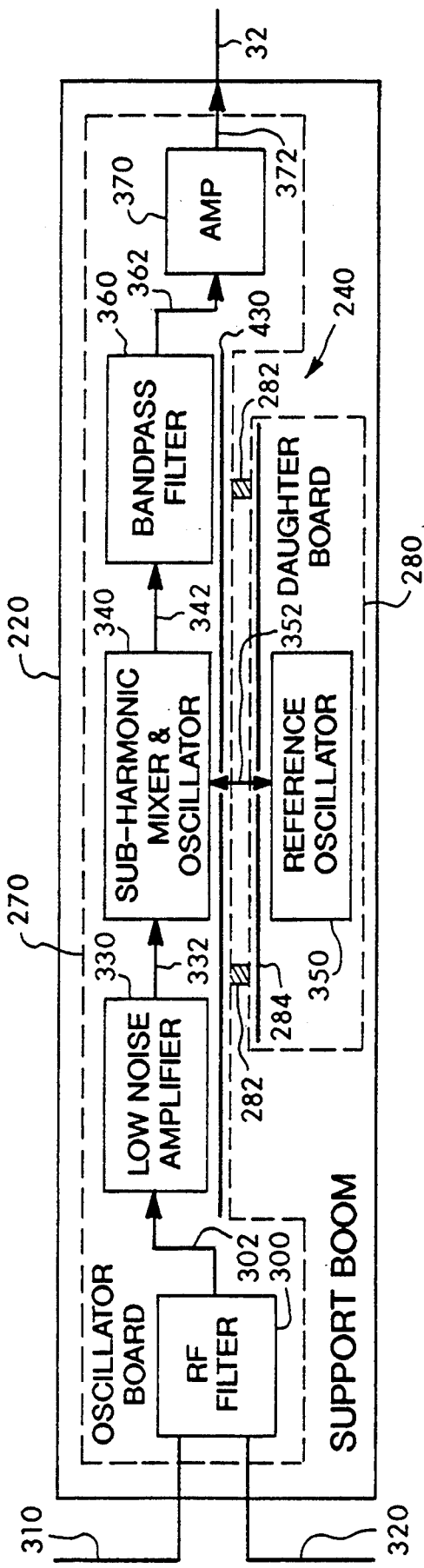
FIG. 3 is a block diagram of the electronic components of the present invention.

In FIG. 3, the block diagram circuit details of the integrated down converter 240 are shown. The oscillator board 270 and the daughter board 280 are located within the support boom 220. As shown in FIG. 2, spacers 282 space the daughter board 280 from the oscillator board 270. The bottom ground plane 430 of the first printed circuit board (i.e., oscillator board) 270 faces the bottom ground plane 284 of the second printed circuit board (i.e., daughter board) 280. The spacing (i.e., caused by spacers 282) and the orientation of the daughter board (i.e., bottom ground planes 430 and 284 facing each other) isolate the electronics on the first and second boards and minimize any signal interferences between the operation of the two boards.

On the oscillator board 270 is located an RF filter 300 which is directly connected to the feed elements 310 and 320. The RF filter 300 is connected over line 302 to a low noise amplifier 330 which in turn is connected to the sub-harmonic mixer and oscillator 340 via lines 332. The Rf filter 300 and the amplifier 330 constitute input circuitry. The sub-harmonic mixer and oscillator 340 receives an error correction signal from the reference oscillator 350 over line 352. The sub-harmonic mixer and oscillator 340 is interconnected to a bandpass filter 360 over lines 342. The bandpass filter 360 is connected to an amplifier 370 over lines 362. The bandpass filter 360 and the amplifier 370 constitute output circuitry. The amplifier 370 is connected to the coax 32. The down converter circuitry utilized to implement the components of FIG. 3 is well known and the details of this circuitry are not necessary for the teachings of the present invention.

From an operational point of view, the RF filter 300 is directly coupled to the feed elements 310 and 320. The details of this direct interconnection will be discussed subsequently. The RF filter provides front end selectivity. The front end selectivity is gained by a combination transmission line and lump component high pass filter. As will be discussed subsequently, the filter is shielded on the top, bottom, and sides to eliminate the potential for IF frequencies passing through the cavity defined by the support boom 220 and entering the active circuits. The RF filter 300 provides bandpass filtering for incoming signals from feed elements 310 and 320 above 2480 MHz. The filter 300 could be the aforesaid high pass design or could be designed as a bandpass filter in the range of about 2480 to 2700 MHz.

Figure 5:
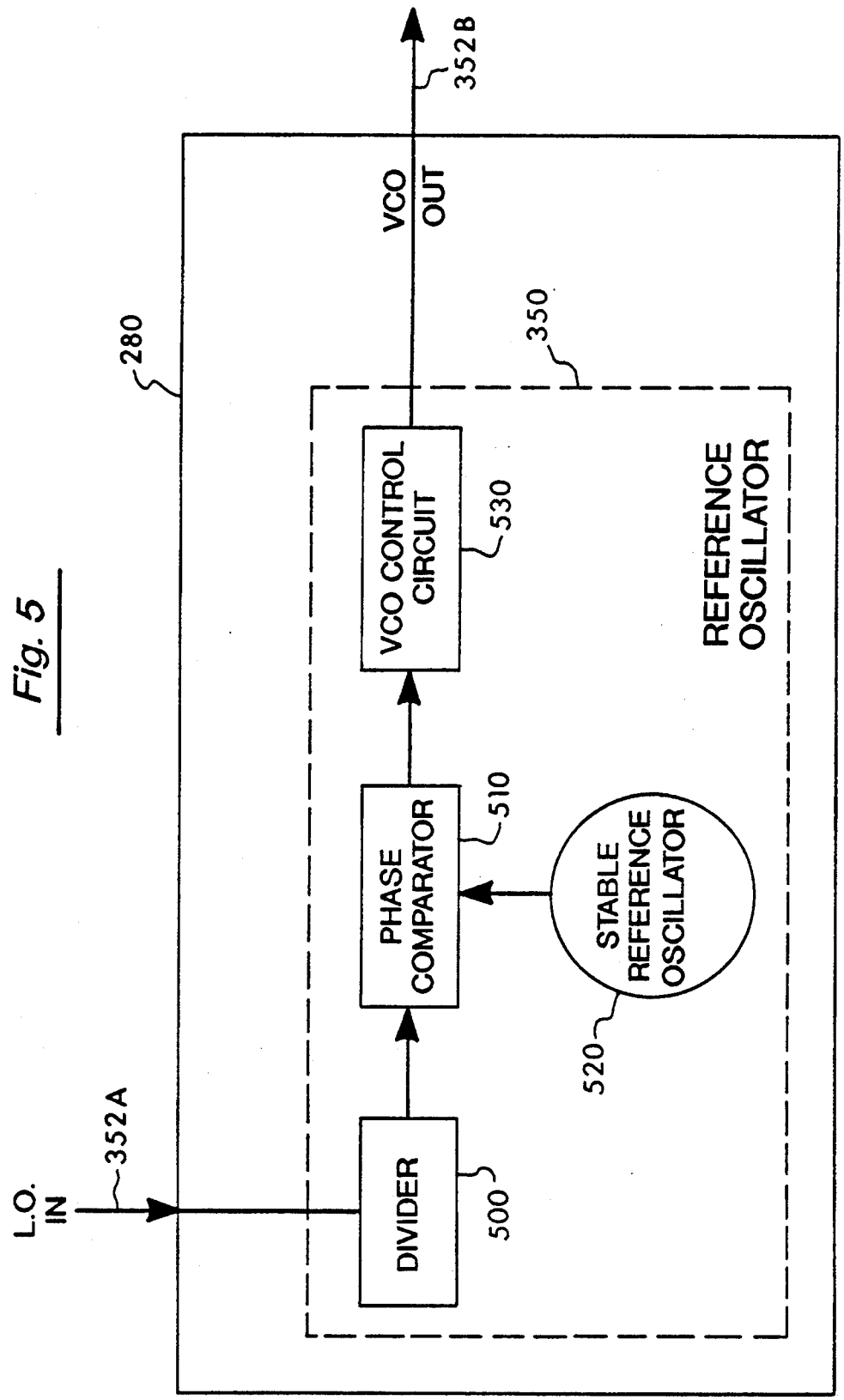
FIG. 5 sets forth the electronic circuitry for the daughter board of the present invention.

The low noise amplifier 330 provides sufficient gain to establish overall noise figure. The output of the low noise amplifier 330 is delivered over lines 332 to the sub-harmonic mixer and oscillator 340. It is to be understood that any suitable mixer design such as an active or single diode design could be utilized. In the preferred embodiment, the oscillator is a single bi-polar transistor in a common collector configuration. Frequency stability is achieved by locking the oscillator to a stable reference oscillator 350 which is delivered over line 352 from the daughter board 280, as shown in FIGS. 3 and 5. The reference oscillator 350 utilizes phase lock loop circuitry and is located on the separate daughter board 280 to minimize the potential for digital noise in the sub-harmonic mixer and oscillator 340. In FIG. 5, the daughter board 280 receives the local oscillator signal on line 352A from the sub-harmonic mixer and oscillator 340. This signal is delivered into a divider circuit 500 and is then transferred into the phase comparator 510 for comparison to a reference signal from the stable reference oscillator 520. If any differences are detected, the control circuit 530 adjusts the voltage control output $V_{co}$ and delivers it back over line 352B to oscillator 340. Noise and signal interference are minimized by (1) separating the reference oscillator onto a second printed circuit board, (2) spacing the separate printed circuit board from the oscillator board, and (3) orienting the bottom ground plane of the second printed circuit board to face the bottom ground plane of the oscillator board. The spacing 282 and the orientation of ground planes 430 and 284 are illustrated in FIGS. 2 and 3.

Once the RF signal on lines 332 is mixed to the desired output frequency by circuit 340, the output signal is delivered on lines 342 into the bandpass filter 360. The bandpass filter filters the output signal on lines 342 according to customer requirements, such as, for example, in the range of 150–288 MHz.

The filtered signals are delivered on lines 362 to the output amplifier 370 which functions to amplify the signals with approximately 18dB gain.

Finally, the coax 32 is connected directly to the output of the amplifier 370 and delivered as shown in FIG. 1. It is to be expressly understood that a number of different electronic circuits could be utilized as a down converter for MMDS applications and that the present invention is not to be limited to the application of a particular design.

3. Front End Filter Shield

Figure 4:
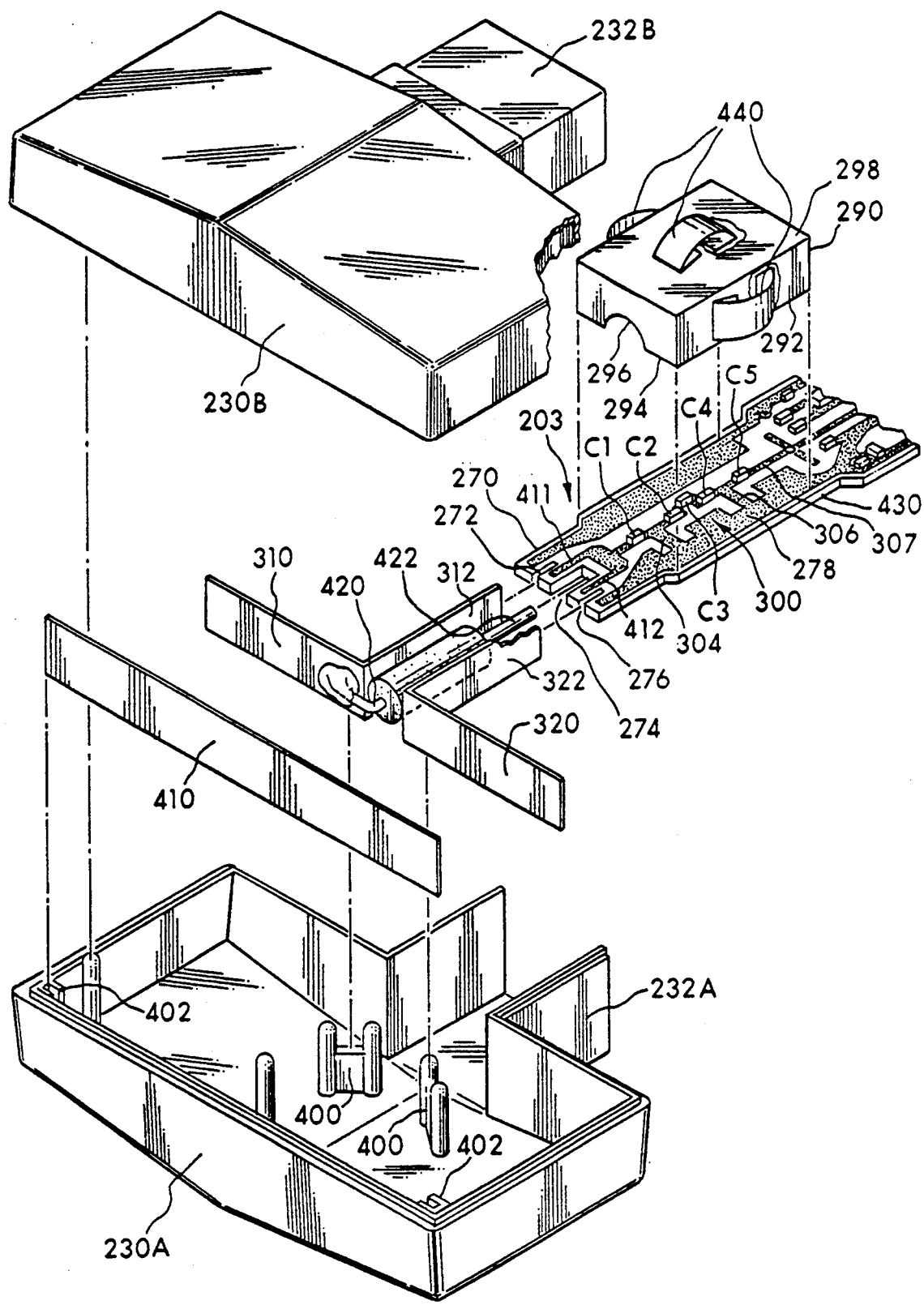
FIG. 4 is an exploded view of the front end of the down converter of the present invention with respect to the drive elements and the housing for the drive elements.

In FIG. 4, the details of the feed housing 230 and the front end filter shield 290 are shown. In FIG. 4, the feed housing 230 consists of a female portion 230A and a male portion 230B. The two portions are designed to fit together to form a weatherproof housing as shown. The driven elements 310 and 320 are held within the housing 230 by pedestals 400. A sub-reflector 410 is held within the housing 230 by slots 402. Also shown in FIG. 4 is the oscillator printed circuit board 270. Printed circuit board 270 at the feed end has three formed slots 272, 274, and 276. Driven element 310 is inserted into slot 272 while driven element 320 is inserted into slot 276. In FIG. 4, connection leg 322 is soldered to top ground plane 278 and bottom ground plane 430 of oscillator board 270. Connection leg 312 of the driven element is soldered to top ground plane 278 and bottom ground plane 430 of oscillator board 270. The balun center conductor 420 has its end 422 soldered to copper pads 411 and 412. It is to be expressly understood that the design of balun 420 could vary and that the teachings of the present invention are not limited to the design illustrated.

As can be observed, the driven elements 310 and 320 are directly soldered to the oscillator board 270 to directly input the RF filter 300. A separate coax is not required. The advantages of this direct connection are (1) the elimination of a weather seal, (2) lower insertion loss, (3) lower cost, and (4) improved impedance matching.

Figure 10:
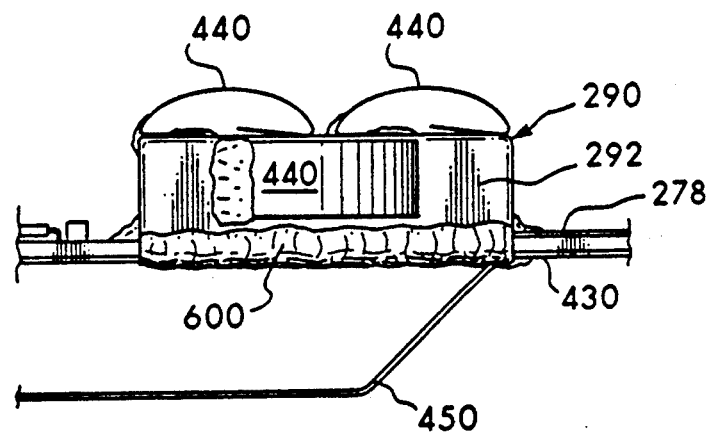
FIG. 10 is a side planar view of the front end filter shield.

As shown in FIGS. 4, 6 and 10, a front end filter shield 290 of solid conductive material (e.g., copper) is designed to be placed over the input RF filter 300. The front end filter shield 290 has the bottoms of its opposing sides 292 and opposing ends 294 soldered 600 to the top ground plane 278 of the oscillator board 270 and to the bottom ground plane 430. Opposing arcuate cutouts 296 are not soldered to the ground plane 278 so as to provide signal pathways. Three ground clips 440 are soldered to the filter shield 290 as shown in FIG. 4 on three sides of the shield 290 (i.e., top 298 and opposing sides 292). The ground clips 440 are designed to firmly abut the inside sidewalls 602 of the support boom 220. As shown in FIG. 2, a fourth ground shield clip 450 is soldered to the bottom ground plane 430 of oscillator board 270 under the shield 290. The four ground clips firmly position and hold the input end 203 of the oscillator board 270, connected to the driven elements 310 and 320, in place within the support boom 220. The four ground clips also provide electrical contact with the interior sidewalls 602 of the metal support boom. FIGS. 6 and 10 illustrate the front end filter shield 290 soldered 600 to the ground planes 278 and 430 of the oscillator board 270. The end 203 is also shown fully supported and positioned within the interior 610 of the boom 220 by the ground clips 440 and 450. The ground clips 440 and 450 firmly electrically contact the grounded metallic boom to provide substantial shielding of the input RF filter 300 and to prevent unwanted signals from propagating into the hollow interior of the boom and into the downstream circuitry of the down converter. For example, the front end filter shield 290 eliminates the potential for out of band (including IF) frequencies passing through the cavity of the boom 220 and entering the active circuitry of the down converter. The boom 220 is fully grounded to the shield which in turn is grounded to the ground planes 278 and 430.

It is to be expressly understood that a number of different configurations for designing the shield 290 of the present invention could be utilized.

4. Coax Bracket

Figure 9:
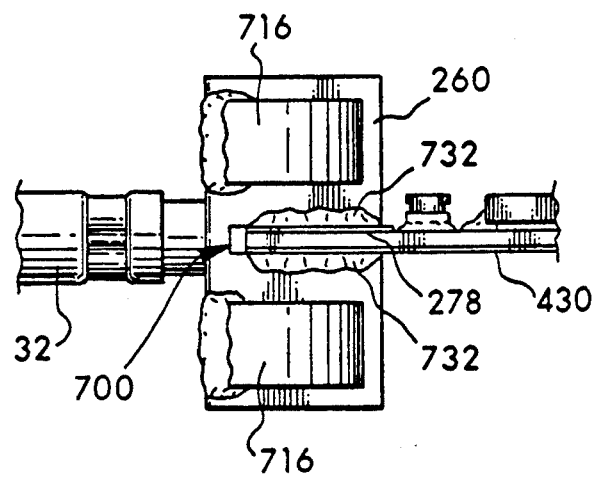
FIG. 9 is a side planar view of the coax ground shield of FIG. 8.

In FIGS. 7–9, the output end 205 of the oscillator board 270 is shown interconnected to a coax bracket 710. The coax bracket 710 is formed of solid conductive material (e.g., copper) and is designed to be soldered to the output end 205 of the oscillator board 270. The end 205 of the oscillator board has two opposing ground pads 720 and 730 with the output signal lead 372 disposed there between. Lead 372 is connected to the output of amplifier 370. The coax bracket 710 has two legs 712 and 714. On the external opposing sides of each leg, 712 and 714, are soldered two ground clips 716. Each leg 712 and 714 has a formed slot 718 which is designed to slip over end 700. As shown in FIG. 9, legs 712 and 714 are soldered 732 on both sides of the legs 712 and 714 to the top ground pads 720 and 730 and to the bottom ground plane 430. In other words, the upper and lower edges of the slots 718 are soldered on both sides 278 and 430 of the ground plane. This provides a solid electrical ground connection.

As shown in FIGS. 8 and 9, an innerbarrel 800 is soldered to the coax bracket 710. The coax 32 has its center conductor 810 exposed with approximately ¼ inch of the center insulation 820 exposed. The center conductor 810 is mounted through the innerbarrel 800 and the center conductor 810 is soldered to the strip 372. The ground sheath 830 of coax 32 is crimped to the innerbarrel 800. Crimp ring 840 is used to accomplish this. In this fashion, the ground sheath 830 is fully grounded to the coax bracket 710 which in turn is fully grounded to the ground plane of the circuit board to prevent unwanted signals from entering the boom via the coax or the end of the boom nearest the antenna. The ground clips 716 center the end 205 of the oscillator board within the hollow interior of boom 220 in a fashion set forth in FIG. 6. The ground clips 716 also fully ground the end 700 of the board 270 to the internal sides of the support boom 220.

5. Dual Band Down Converter

Figure 11:
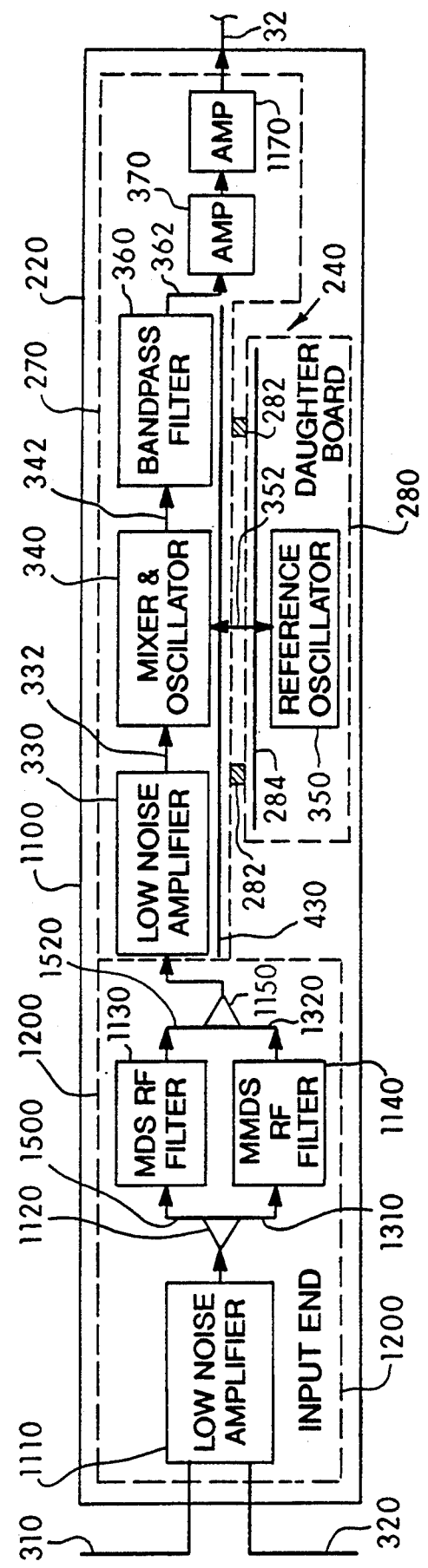
FIG. 11 is a modified block diagram of FIG. 3 showing the dual band electronics.

FIG. 11 sets forth a modification of the down converter in FIG. 3 to incorporate dual microwave band reception such as in the MDS and MMDS frequency ranges. Where possible, like reference numerals are used to indicate corresponding like components.

In FIG. 11, the down converter 1100 is dual band and, in the first embodiment, is fully integrated into the boom. The signals received by the dipole elements 310 and 320 are amplified by a first low noise amplifier 1110 and then delivered into a first diplexer circuitry 1120. The diplexer 1120 functions to separate MDS signals from the MMDS signals which are received by the dipole elements 310 and 320. Hence, the dual band down converter 1100 of the present invention functions to receive programming signals over the MMDS/MDS frequency ranges.

The low noise amplifier 1110 is optional and its use is designed for fringe area reception. The use of the low noise amplifier 1110 and amplifier 1170 is more fully discussed in related co-pending application entitled "Low Noise Integrated Antenna and Down Converter" and filed "May 27, 1993, Ser. No. 08/068,643 now U.S. Pat. No. 5,313,220". When the low noise amplifier 1110 is not used, the dipole feed 310, 320 connects directly into the diplexer 1120.

From the diplexer 1120, the MDS/MMDS signals flow over separate paths to their respective RF filters 1130 and 1140. RF filter 1130 functions in the MDS range of 2150 MHz through 2162 MHz and RF filter 1140 functions in the MMDS range of 2500 MHz through 2686 MHz. The filtered output signals of each filter are then recombined by a second diplexer circuit 1150. As in FIG. 3, the output of the second diplexer 1150 is fed into the input of a second low noise amplifier 330. The integrated down converter then functions as previously described with respect to FIG. 3 except the circuitry is modified to pass both the MDS and MMDS frequencies.

As shown in FIG. 11, the input end of oscillator board 270 contains the low noise amplifier 1110, the first and second diplexers 1120 and 1150, respectively, and the two RF filters 1130 and 1140. The heart of the dual band down converter 1100 consists of the diplexing circuitry 1120 and 1150, associated MDS and MMDS filters 1130 and 1140, shield 1210, clips 1220, and shield 1230 and plurality of vias 1242 which allow upper ground plane 1240 and lower ground plane 1250 to function as one ground plane.

Figure 12:
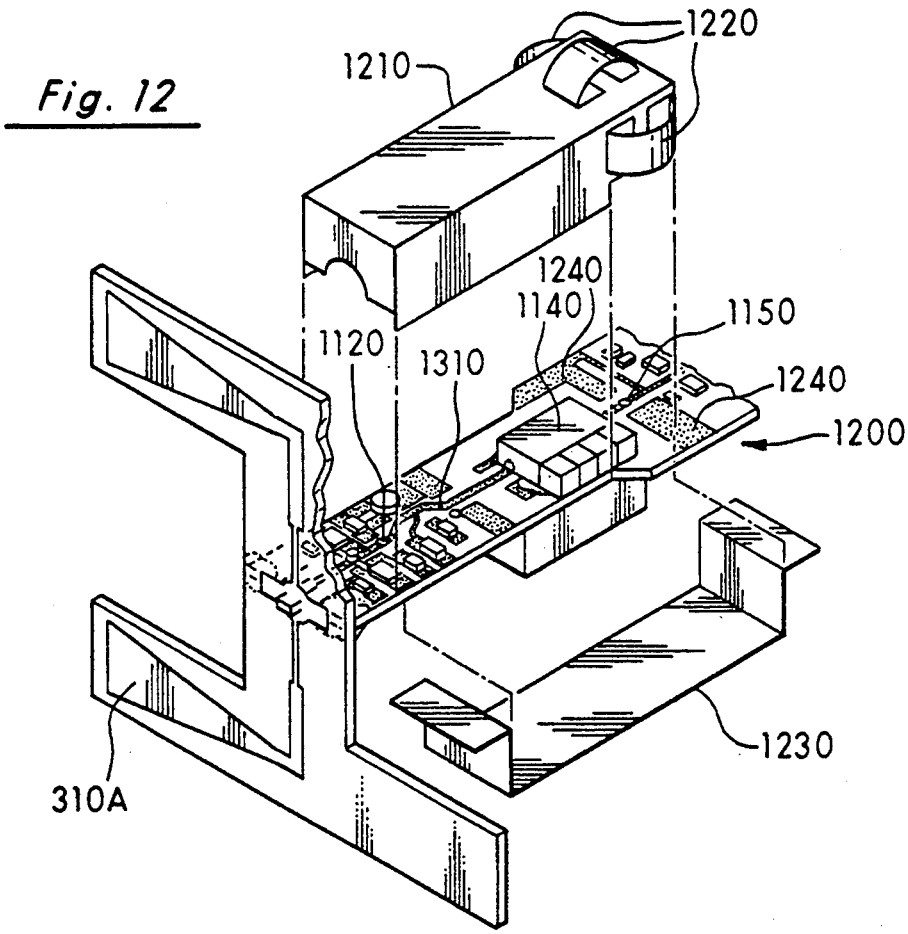
FIG. 12 is a top perspective illustrating the electronics for the MDS filter.

In FIGS. 12 and 14, the construction of the input end 1200 of the dual band down converter 1100 is shown. The input end is connected to a stacked dipole feed comprising elements 310A and 320A. These dipole elements 310A and 320A are the subject of Ser. No. 07/773,108, now U.S. Pat. No. 5,229,782, assigned to the same assignee of the present invention and entitled "Stacked Dual Dipole MMDS Feed." It is to be expressly understood that any dipole feed designed to operate in the desired frequency ranges could be used under the teachings of the present invention.

Figure 13:
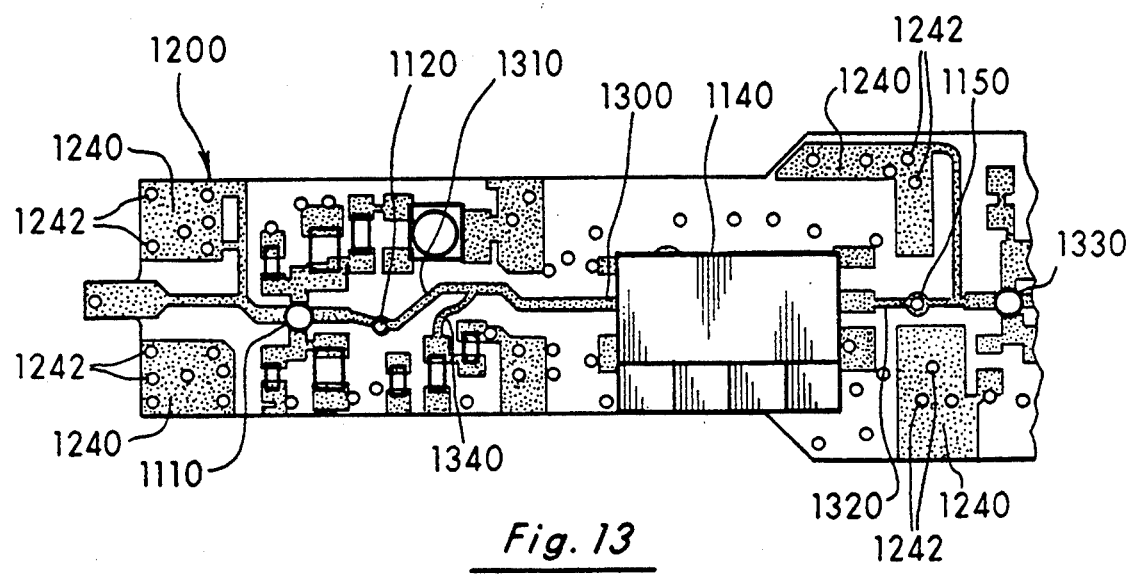
FIG. 13 is a top planar view of the printed circuit board setting forth the components for the MDS RF filter section.

As shown in FIGS. 13 and 15, which represent the opposing planar views of the input end 1200 of the printed circuit board, two plated-through-holes form diplexers 1120 and 1150, respectively. While the preferred embodiment uses plated-through-holes, it is to be understood that any other equivalent structure such as eyelets or wires could also be used to provide a through-board connection. The first plated-through-hole 1120 separates the MDS and MMDS signals. MDS signals travel down the plated-through-hole 1120 and over the spiral coil trace 1500 (FIG. 15) on the bottom of the input end 1200. The MDS signals then travel along the spiral coil trace 1500 to the input 1510 of the MDS RF filter 1130. The MMDS signals travel around the plated-through-hole 1120 and stay on the upper surface (FIG. 13) by travelling over trace 1310 and then enter the input 1300 of the MMDS filter 1140.

In operation, the MDS signals (2150–2162 MHz) experience a relatively high impedance path from the plated-through-hole 1120 towards the MMDS filter 1140 due to the printed circuit board trace 1310 and input 1300 to the MMDS filter 1140 combining together to produce, in effect, an open ended stub less than ¼ wavelength long at these MDS frequencies. Ideally, the length of the trace 1310 is zero and, in that ideal location, the input 1300 would be at the plated-through-hole 1120. Because of real estate limitations on the printed circuit board with the components, the trace 1310 has a length which is less than ¼ wavelength at the center frequency of the MDS frequencies or 1.300 inches at the center frequency of 2156 MHz. The width of trace 1310 is preferably 20 mils but in the range of 18 to 22 mils and the width affects the Quality, Q, of the MMDS signals. The bends shown in the traces are not critical. Trace 1340 provides voltage to amplifier 1110.

On the other hand, the MMDS signals (2500–2686 MHz) experience a high impedance path towards the MDS filter 1130 due to the spiral trace 1500 and input 1510 to the MDS filter 1130 combining together to produce, in effect, an open ended stub ½ wavelength long at MMDS frequencies. As above, ideally the length of trace 1500 is zero, but again due to the PCB real estate limitations is designed to be equal to ½ wavelength open stub at the center MMDS frequency of 2593 MHz or 2.080 inches. The width of trace 1500 is preferably 40 mils but in the range of 37 mils to 43 mils and the width affects the Quality, Q, of the delivered MDS/MMDS signals.

After passing through their respective RF filters 1130 and 1140, the filtered MDS and MMDS signals are combined back together at the second plated-through-hole 1150 in a similar fashion as described above.

As shown in FIGS. 12 and 14, the upper surface of the input end 1200 has a grounding shield 1210 with grounding clips 1220 positioned there around. The grounding shield 1210 covers the low noise amplifier 1110, the diplexer 1120, and the filter 1140. This provides effective shielding as discussed above for shield 290 in FIG. 6. A lower ground shield 1230 is provided which provides shielding over the plated-through-holes 1120 and 1150 and the MDS filter 1130. Lower shield 1230 corresponds to lower shield 450 of FIG. 10. The use of grounding shields is more critical because of the two microwave bands present. Two shields are necessary to provide a shield for each filter. Shielding the filters prevents signals from radiating around the filters and reducing their effectiveness. The goal is to provide ground shielding over both RF filters and the accompanying diplexers. The first ground shield 1210 is preferably soldered to the top ground plane 1240. The second ground shield 1230 is preferably soldered to the bottom ground plane 1250. Both shields 1210 and 1230 provide ground shields covering the filters 1130 and 1140 as well as diplexers 1120 and 1150.

In the preferred embodiment, the low noise amplifier 1110 is Model No. NE76038 available from California Eastern Laboratories, Inc., 3260 Jay Street, Santa Clara, Calif. 95054. The MDS/MMDS filters 1130 and 1140 are conventional RF filters such as those available as DFC32R 15P020 BTO (MDS) and DFC 42R 59P 186BFA (MMDS) from Murata Erie North America, 900 West College Avenue, State College, Pa. 16801.

In FIG. 11, a dual band down converter 270 is shown using a common low noise amplifier 1110 to receive both MDS and MMDS signals. These combined signals are delivered through the diplexer 1120 (which in the preferred embodiment is a plated-through-hole, but could comprise other diplexer designs) and into two separate RF filters 1130 and 1140. In the preferred embodiment, as shown in FIGS. 12–15, the RF filters 1130 and 1140 are located on opposite sides of the input end of a printed circuit board. While this represents a low cost design approach, it is to be expressly understood that the location of the two filters could be side by side on the same surface of the printed circuit board or could be in an adjacent parallel relationship not commonly sharing the same printed circuit board. For example, the low noise amplifier could be mounted onto a printed circuit board and then the output of the low noise amplifier 1110 could be interconnected to a diplexer such as a bar diplexer which delivers the appropriate signals into their respective RF filters in a side by side parallel relationship. Under the teachings of the present invention, the design approach set forth in FIGS. 11–15 represents the preferred embodiment which is a low cost approach to the design of the input end of the present invention. However, under the teachings of the present invention, alternate design approaches could be incorporated to functionally carry out the present invention.

The outputs of the RF filters 1130 and 1140 are then delivered into a common diplexer 1150 (the second plated-through-hole) and into common down converter circuitry. The common down converter circuitry may include the components shown in FIG. 11 of the low noise amplifier 330, the mixer and oscillator 340, the bandpass filter 360, and the amplifiers 370 and 1170. This would also include the reference oscillator 350. The sharing of these common components significantly reduces the cost of the dual band down converter of the present invention. The design of these components may vary from design requirement to design requirement. In the preferred embodiment, the amplifier 1170 is Part No. MSA-1105 available from Hewlett Packard/Avantek.

While the preferred microwave bands are MDS and MMDS, it is to be expressly understood that in other countries of the world, other microwave frequency bands are used and that the present invention could be modified to encompass a first desired microwave frequency and a second desired microwave frequency and that the teachings of the present invention are not limited to the MDS and MMDS bands. For example, in Australia the two microwave bands would be 2076 to 2111 MHz and 2302 to 2400 MHz.

Finally, the dual band down converter of the present invention could be provided in a conventional fashion in a separate box at the rear of the parabolic antenna. While the preferred embodiment places the dual band down converter into the support boom, the teachings of the present invention are not so limited.

It is to be expressly understood that the claimed invention is not to be limited to the description of the preferred embodiment but encompasses other modifications and alterations within the scope and spirit of the inventive concept.

We claim:

1. A dual band down converter receiving system for simultaneously receiving from a feed first microwave signals in a first frequency range and second microwave signals in a second frequency range, said system comprising:
   a printed circuit board, said printed circuit board having a first ground plane on a first surface, a second ground plane on a second surface opposing said first surface, and an input end,
   means connected to said feed for delivering the first microwave signals over a first path and the second microwave signals over a second path,
   a first filter mounted on said first surface of said input end of said printed circuit board and connected to said first path for filtering said first microwave signals,
   a second filter mounted on said second surface opposing said first surface of said input end of said printed circuit board and connected to said second path for filtering said second microwave signals, said delivering means including:
   (i) a first through-board-connection in said printed circuit board,
   (ii) a first trace on said first surface of said printed circuit board connected between said throughboard-connection and the input of said first filter, said first trace being a one-half wavelength open stub at the center frequency of said second frequency range, and (iii) a second trace on said second opposing surface of said printed circuit board connected between said through-board-connection and the input of said second filter, said second trace having a length less than one-quarter of the wavelength of the center frequency of said first frequency range, means connected to the outputs of said first and second filters for combining said first microwave signals and said second microwave signals at a common output, said combining means including:

(i) a second through-board-connection in said printed circuit board, (ii) a first trace on said first surface of said printed circuit board connected between said second through-board-connection and the output of said first filter, and (iii) a second trace on said second opposing surface of said printed circuit board connected between said second through-board-connection and the output of said second filter.

2. The system of claim 1 wherein said delivering means further includes:

a low noise amplifier having an input located on the input end of said printed circuit board, the input of said low noise amplifier electrically coupled to said feed, the output of said low noise amplifier coupled to said first through-board-connection, said low noise amplifier amplifying said first and second microwave signals from said feed.

3. The system of claim 1 wherein said first frequency range is the MDS band of 2150 MHz to 2162 MHz and wherein said second frequency range is the MMDS band 2500 MHz to 2686 MHz.

4. An integrated dual band down converter system for simultaneously receiving signals in first and second microwave frequency bands, said integrated dual band down converter system comprising:

a printed circuit board, said printed circuit board having first and second ground planes, said printed circuit board having an input end, a first diplexer for delivering the first microwave frequency band signals over a first path on said printed circuit board and the second microwave frequency band signals over a second path on said printed circuit board, a first filter on a first surface of said printed circuit board and connected to said first path for filtering said signals in said first microwave frequency band over said first path, a second filter on a second surface opposing said first surface and connected to said second path for filtering said signals in said second microwave frequency band over said second path, a second diplexer connected to said first and second filters for combining said signals in said first and second microwave bands at a common output, first means for shielding said first filter, said first shielding means electrically connected to said first ground plane of said printed circuit board, second means for shielding said second filter, said second shielding means electrically connected to said second ground plane of said printed circuit board.

5. The system of claim 4 further comprising a low noise amplifier connected to said first diplexer.

* * * * *